United States Patent [19]
Contois et al.

[11] Patent Number: 6,123,577
[45] Date of Patent: Sep. 26, 2000

[54] LAN PATCH PANEL AND WALL MOUNT UNIT ASSEMBLY

[75] Inventors: Dennis R. Contois, San Jose; Paul E. Christenson, Sunnyvale; Jack Andresen, Palo Alto, all of Calif.

[73] Assignee: Energy Transformation Systems, Inc., Menlo Park, Calif.

[21] Appl. No.: 08/797,486

[22] Filed: Feb. 6, 1997

Related U.S. Application Data

[60] Provisional application No. 60/011,214, Feb. 6, 1996.

[51] Int. Cl.[7] .................................................. H01R 13/60
[52] U.S. Cl. ............................................ 439/535; 439/676
[58] Field of Search ........................ 174/53, 54; 361/761, 361/763, 766; 439/44, 47, 395, 404, 532, 535, 536, 540.1, 76.1, 676, 941

[56] References Cited

U.S. PATENT DOCUMENTS

| 4,894,024 | 1/1990 | Debortoli et al. | 439/535 |
| 4,909,757 | 3/1990 | Reed | 439/532 |
| 5,326,284 | 7/1994 | Bohot et al. | 439/607 X |

*Primary Examiner*—Khiem Nguyen
*Attorney, Agent, or Firm*—David M. Ostfeld

[57] ABSTRACT

The present invention discloses a new and novel patch panel and wall unit assembly for use in local area network (LAN) wiring and installation. The patch panels and wall units include a new printed circuit board designed to simplify the installation of LAN's. The patch panels are designed to more closely mimic the wall unit configuration so that more understandable wiring layouts can be presented during LAN wiring installation.

31 Claims, 9 Drawing Sheets

LAN PATCH PANEL AND WALL MOUNT UNIT ASSEMBLY

CROSS REFERENCE TO RELATED APPLICATION

This application claims priority to Provisional Application Ser. No. 60/011,214, Filed Feb. 6, 1996, by Dennis Contois, entitled "A New Lan Patch Panel and Wall Mount Unit Assembly".

FIELD OF THE INVENTION

The present invention relates to a new patch panel and wall unit assembly for more efficient more easily understood wiring schemes and more efficient repositioning of node interconnections in a local area network (LAN). More particularly, the present invention relates to a new and novel patch panel and a new wall mount unit assembly where the patch panels and wall units include a new printed circuit board design to simplify patch panel and wall unit installation and wiring configuration, design and layout.

BACKGROUND OF THE INVENTION

A Local Area Network (LAN) is a system of personal computers, work stations, terminals or devices that are interconnected via a building's structured voice and data wiring to form a network that permits groups of people to work together. A LAN allows these groups of people to access either common data from a mainframe computer, file servers, or each other's common files. It also allows these groups to share common assets such as printers or FAX machines. Well designed LANs make people more productive and reduce capital equipment costs by allowing multiple use of a hardware assets.

Common to all LANs are structured wiring and equipment that helps direct and distribute the data to and from all locations. A typical distribution scheme would be for the output of a host computer to go via the building's internal wiring (typically data grade Unshielded Twisted Pair telephone wire) to a distribution point frequently called "a wiring closet". The equipment in the wiring closet distributes data to and from all the offices, work stations, printers, etc. that are connected to the LAN.

Wiring closets are equipped with a uniform system of vertical racks that are utilized to hold a variety of "rack mounted" components and "black" boxes that are essential to process and distribute data over the LAN. Depending on the size and type of LAN, there can be many of these closets in a building and each one can contain as few as one rack or upwards of 20 or 30 racks.

A common element of almost all LANs are patch panels. Patch Panels are used to cross connect structured wiring to various locations in the building. Typically the patching is from the main host computer to a number of users or from a server to a number of local area networks. In some respects, patch panels can be viewed as glorified junction boxes, a place to connect and redistribute signals.

Existing patch panel technology takes into account the type of structured wiring, such as: Unshielded Twisted Pair (UTP), Shielded Twisted Pair, Coaxial, Twinax or Fiber, and converts it to a conventional connector such as 6 or 8 pin modular jacks, Coaxial MBNC or FBNC, Twinax or Fiber.

Today's products utilize a number of approaches to attach the structure wiring to the panel in order to make electrically satisfactory connections. Some of these methods are: Telco connectors, 66 blocks, 110 blocks, Krone connectors, BNC connectors Twinax Connectors and Fiber Connectors.

Currently, the industry has evolved to data rates up to 155 Mb/s over 100 MHZ rated UTP. This scheme has become very popular because it is a cost effective way to achieve the higher data transmission rates that are required in today's business environment. This scheme is known as "Category 5" or commonly abbreviated as "Cat5".

The TIA/EIA is the industry trade organization that is responsible for defining performance standards for both Cat5 components as well as total installations. Additionally, third party agencies have been formed to test and certify compliance to the EIA/TIA specification that are applicable.

A typical Cat5 patch panel (FIG. 1) has evolved to a 12, 24, 48 or 96 port unit. The front of the panel has horizontal rows of 24 modular jacks 30 and, depending on the style, can be anywhere from one to six rack spaces in width. One rack space equals 1.75". The rear of the panel receives the building wiring via a system of horizontally mounted insulation displacement connectors (commonly called "110 blocks") 20 that are also connected electrically to a specific modular jack 30.

The modular jacks and the insulation displacement connectors are attached to a printed circuit board 40 that is designed to achieve the electrical performance levels as stated in the applicable industry specifications at time of manufacture.

In a Cat5 installation, 4 pairs of wire from the patch panel modular jacks are routed to corresponding jacks on an information outlet located in an office or area that is to be connected to the LAN. Many installations are using the quad jack configuration requiring 4 wiring bundles, each containing 8 wires, for a total of 32 wires to the information outlet.

The layout or mechanical design of the existing Cat5 Patch panels is dictated by the design of the printed circuit board and convention. In existing products the 110 blocks are arranged in long horizontal rows, extending the width of the panel. Since the structured wiring accesses the panel from the side, this arrangement requires installers to work with long lengths of thick wires that are difficult to manage and attach over the entire length of the panel.

The installation of the information outlet at the user's location is equally difficult. In a typical product offering, the insulation displacement blocks are mounted directly to the back of the modular jack. The installer must handle the small jacks and manipulate the wires into place and then, while holding the assembly in his hand, the installer must "punch-down" (industry jargon for performing the insulation displacement operation) and terminate the wires.

In a typical Cat5 installation, this step is repeated 4 times per wall plate and then the jack/insulation displacement assemblies, with the wires connected, must be inserted in the wall plate. The wall plate assembly is then secured to the wall. The wall plate and jacks are matched to the panel via a sequential numbering system that references the patch panel position to a corresponding jack position in the wall plate. The installation is then tested with appropriate test equipment for compliance to Cat5 performance criteria.

A specification compliant Cat5 installation requires specific practices with respect to the routing, forming and positioning of the wires. If these practices are not followed rigorously, the result will be a system that is not specification compliant upon completion. The installation of a specification compliant system is very time consuming and difficult. Current market offerings do not lend themselves to ease of installation and are not user friendly.

Thus, it would represent an advancement in the art to provide LAN installers with a new and superior patch panel and wall unit assembly that simplifies the installation process and renders more understandable wiring design and layout between the patch panel and the wall units.

SUMMARY OF THE INVENTION

The present invention provide a new Patch panel/wall unit assembly for use in Cat5 patch panel installation for LANs, the present assembly includes at least one patch panel and at least one information outlet or wall unit.

The patch panels (See FIGS. 4A, 4B, 5A, 5B) have the following elements: a printed circuit board (PCB) (indicated as 35 in FIG. 4B and 45 in FIG. 5B) that has been designed to satisfy the electrical performance standards as defined by the EIA/TIA; RJ45 Modular Jacks 30; 110 blocks 20; and a Front Panel metal sheet for either a 24 port, indicated as 70, or 48 port, indicated as 80, Patch Panel.

The information outlets or wall units (See FIGS. 2A, 2B, 3A, 3B) have the following elements: a printed circuit board (PCB) indicated as 15 in FIG. 2B and 25 in FIG. 3B, that has been designed to satisfy the electrical performance standards as defined by the EIA/TIA and is common to both the 2 and 4 port outlets; RJ45 Modular Jacks 30; 110 blocks 20; and a Molded plastic wall plate for either a 2 port, indicated as 50 in FIG. 2A, or 4 port, indicated as 60 in FIG. 3A configuration.

BRIEF DESCRIPTION OF THE DRAWINGS

For a further understanding of the nature and aspects of the present invention, reference should be made to the following illustrative Drawings, taken in conjunction with the specification, wherein like parts are given like reference numerals and wherein.

DETAILED DESCRIPTION AND PREFERRED EMBODIMENTS OF THE INVENTION

Figure 1A:
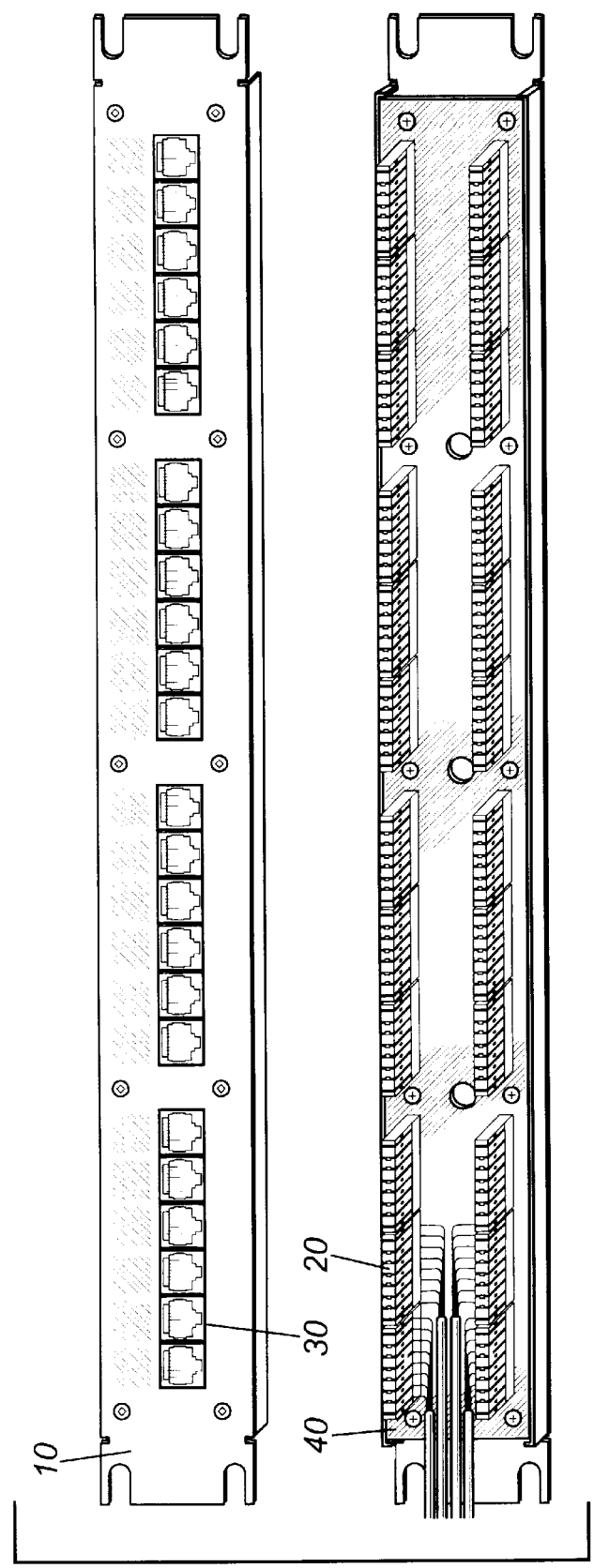
FIG. 1A provides a front view and rear view of a conventional patch panel satisfying the Cat5 standards for a typical 24 port patch panel.
Figure 1B:
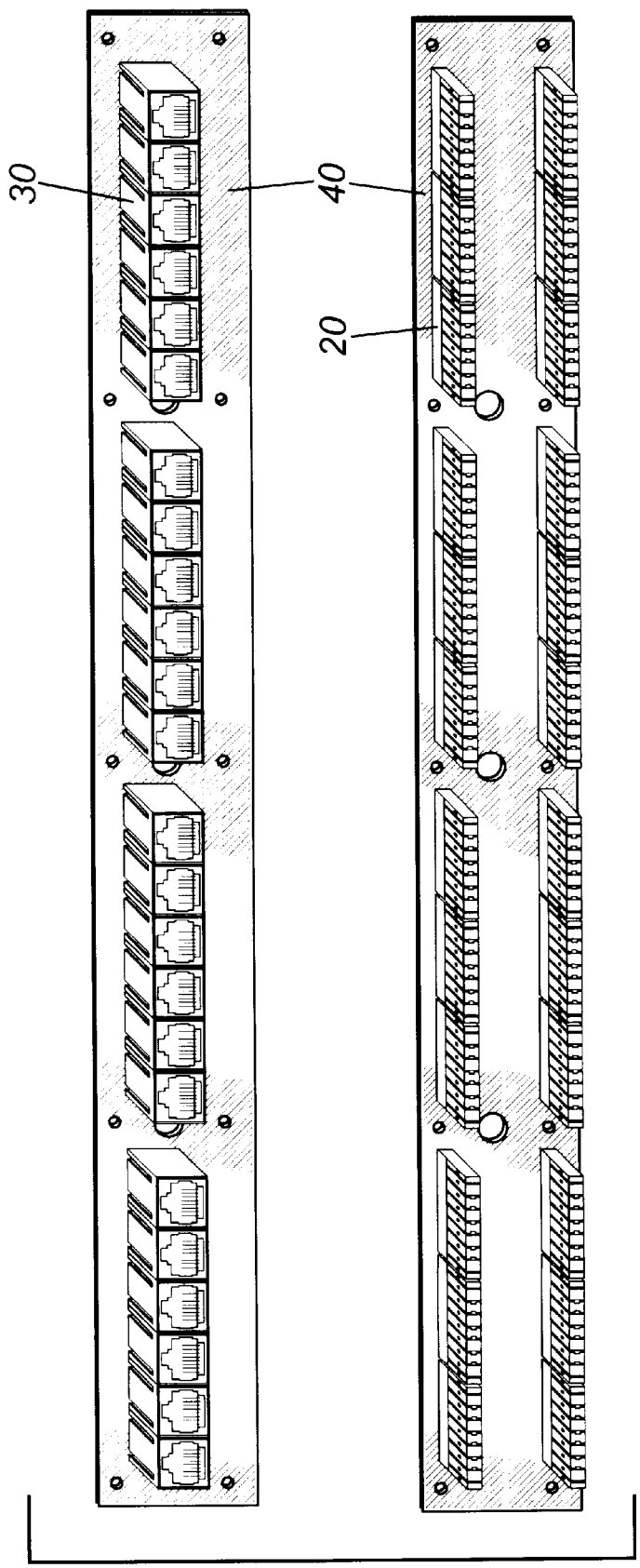
FIG. 1B provides a front perspective view and rear perspective view of a populated PCB for a conventional patch panel satisfying the Cat5 standards for a typical 24 port patch panel.

The present assembly addresses the following areas that are not addressed by current assemblies. For comparison sake, a typical state of the art or conventional Patch panel layout is shown in FIGS. 1A and 1B.

1) The present assembly offers the user the ability to match the configuration and layout of the wall outlet with the Patch Panel as shown in FIGS. 2A, 2B, 3A, 3B, 4A, 4B, 5A, and 5B. This feature aids the installer during installation and the end user thereafter by matching the wall plate jacks to the panel. This feature will speed up installation and reduce errors associated with matching the specific wall outlet jack with its corresponding location in the patch panel.

2) The insulation displacement blocks on the Patch Panels of the present invention are configured in groups of 2 (for a 24 port) or 4 (for a 48 port) running vertically with respect to the panel as shown in FIGS. 4A, 4B, 5A, and 5B; most other competitive offerings run horizontally. The advantage of the insulation displacement blocks running vertically is that by keeping the distances relatively short, typically less than 3.25", it aids the installer in the attachment and routing of the structured wiring to the panel. Wire management (how the wire is routed and positioned) twisting and attachment are key elements of the installation that ensure Cat5 performance.

Figure 2A:
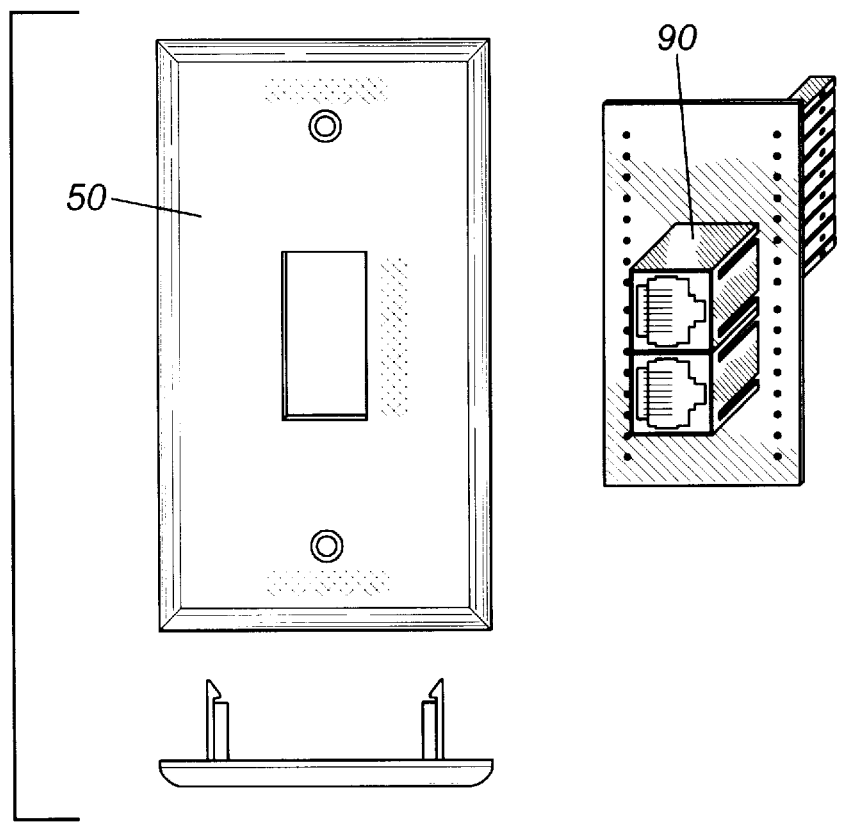
FIG. 2A provides a front view and front edge view of a dual module wall unit mount and a perspective view of a dual wall plate PCB assembly of the present invention.
Figure 2B:
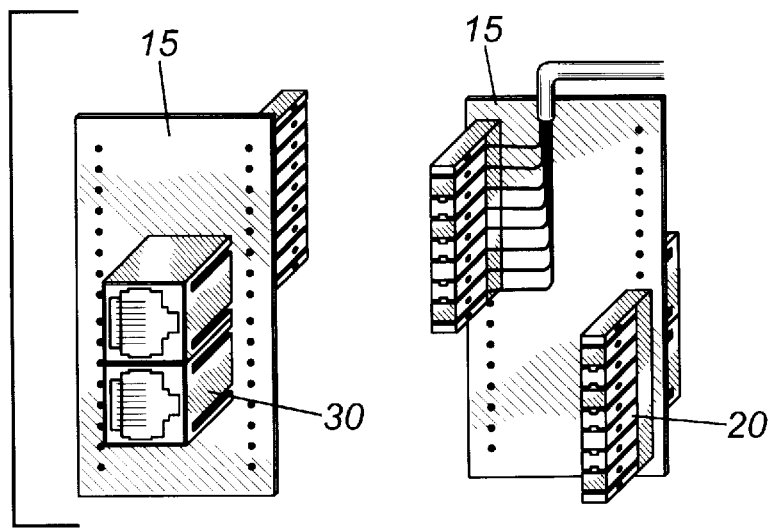
FIG. 2B provides a top and back perspective view of a populated PCB for the dual wall plate of FIG. 2A.
Figure 3A:
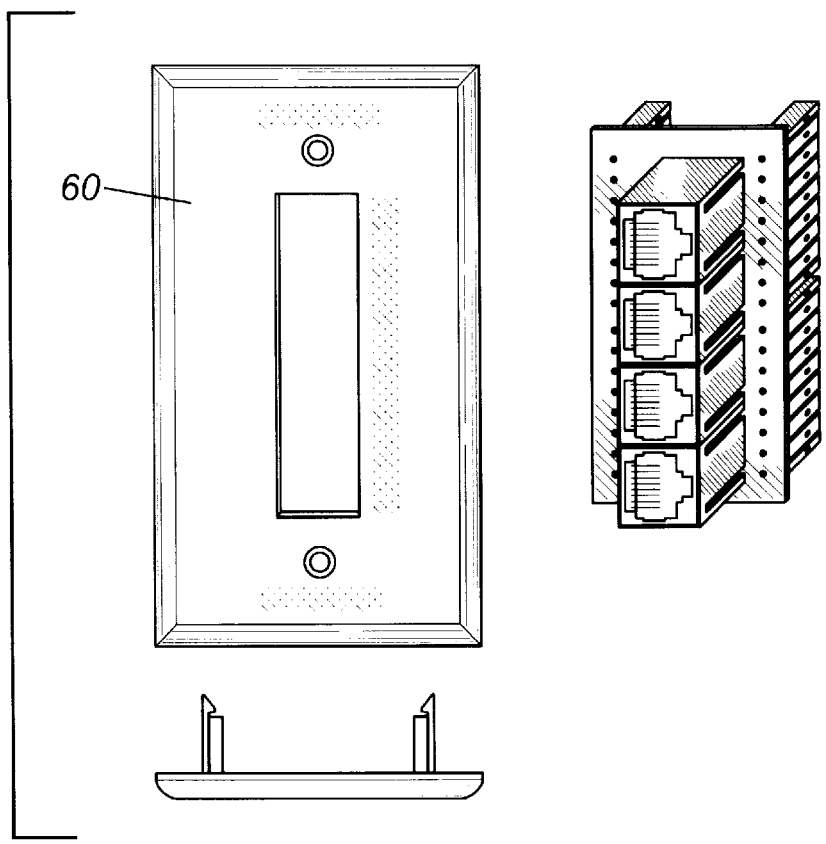
FIG. 3A provides a front view and front edge view of a quad module wall unit mount and a perspective view of a quad wall plate PCB assembly of the present invention.
Figure 3B:
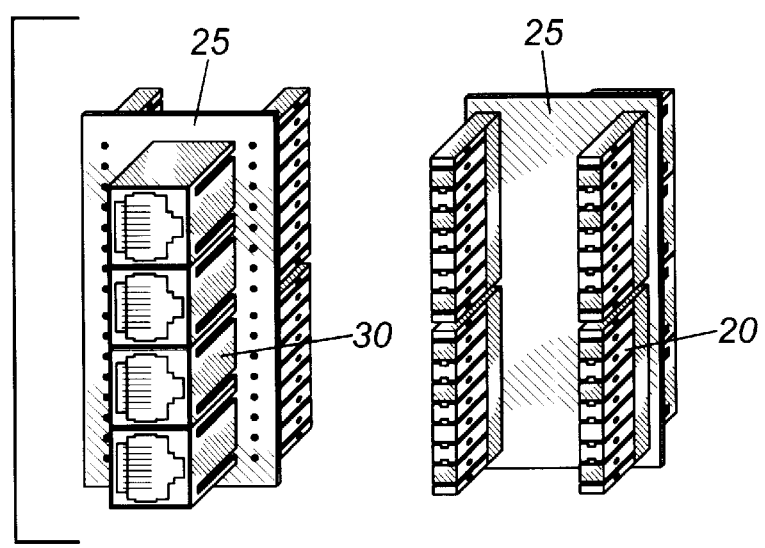
FIG. 3B provides a top and back perspective view of a populated PCB for the quad wall plate PCB of FIG. 3A.
Figure 4A:
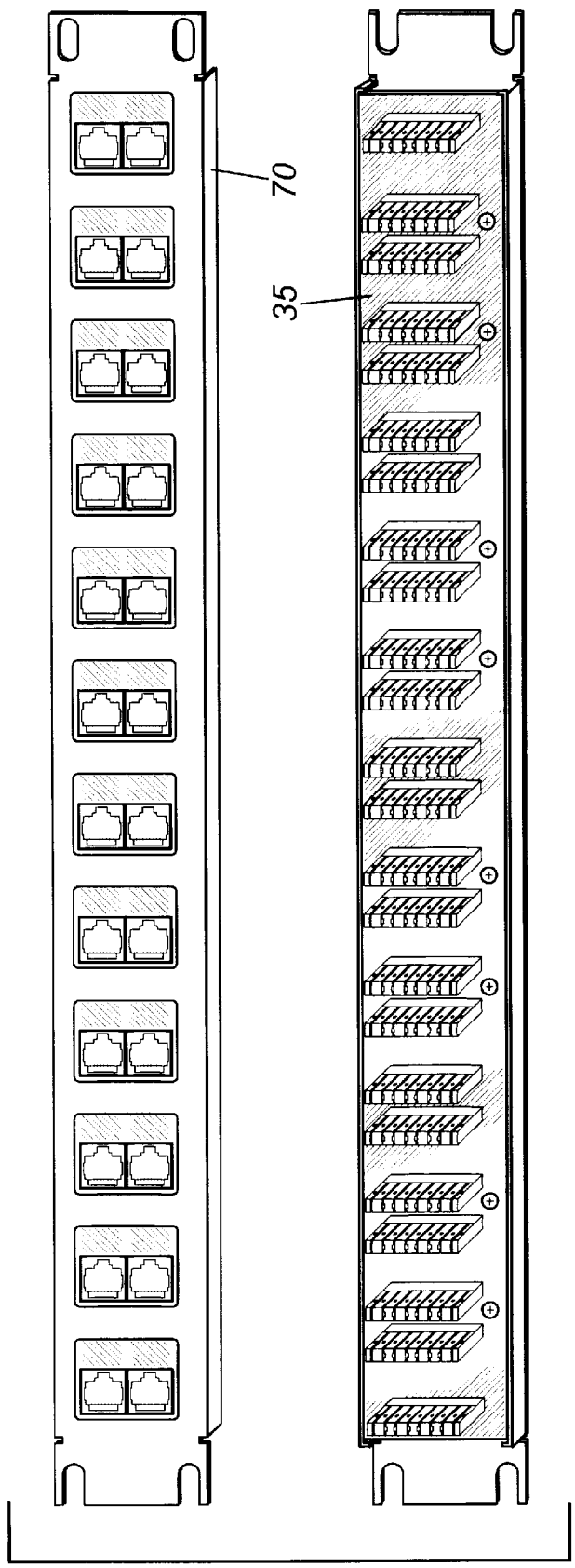
FIG. 4A provides a front view and a rear view of a 24 port patch panel of a preferred embodiment of the present invention.
Figure 4B:
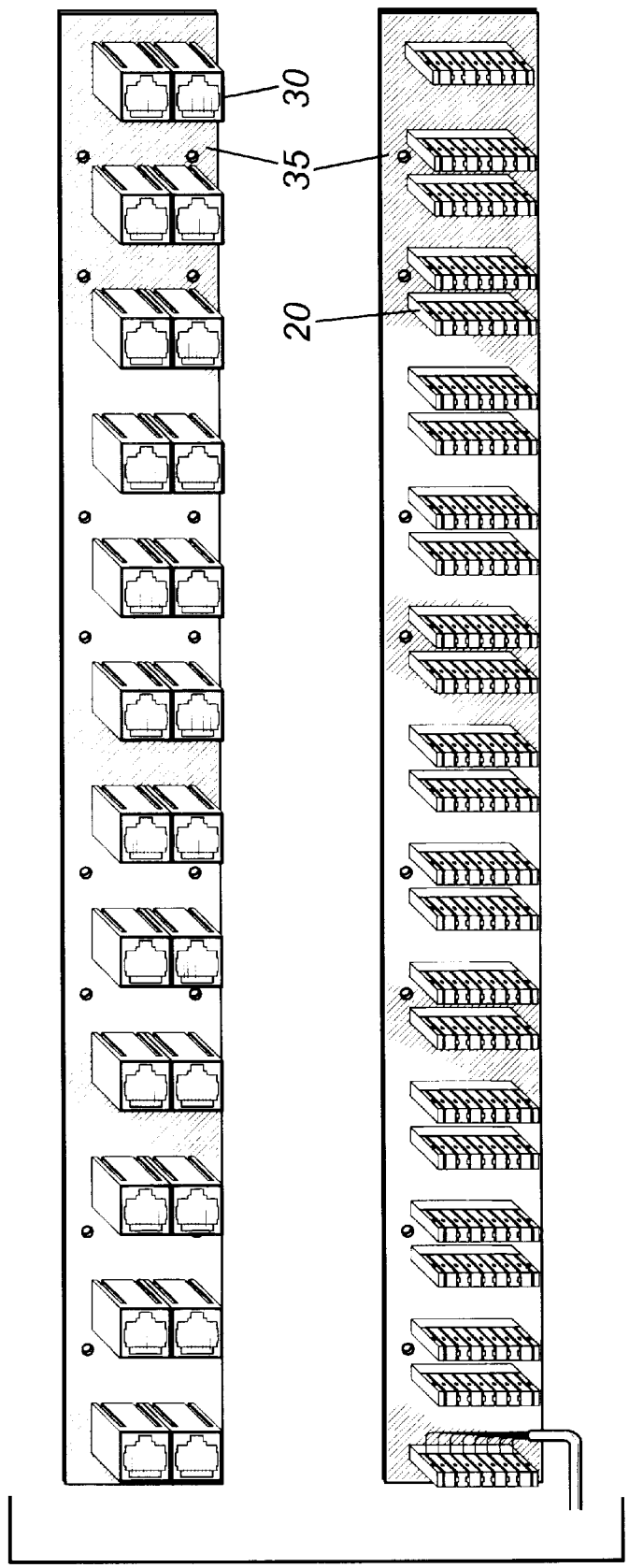
FIG. 4B provides a front perspective view and a rear perspective view of a 24 port populated PCB of a preferred embodiment of the present invention.
Figure 5A:
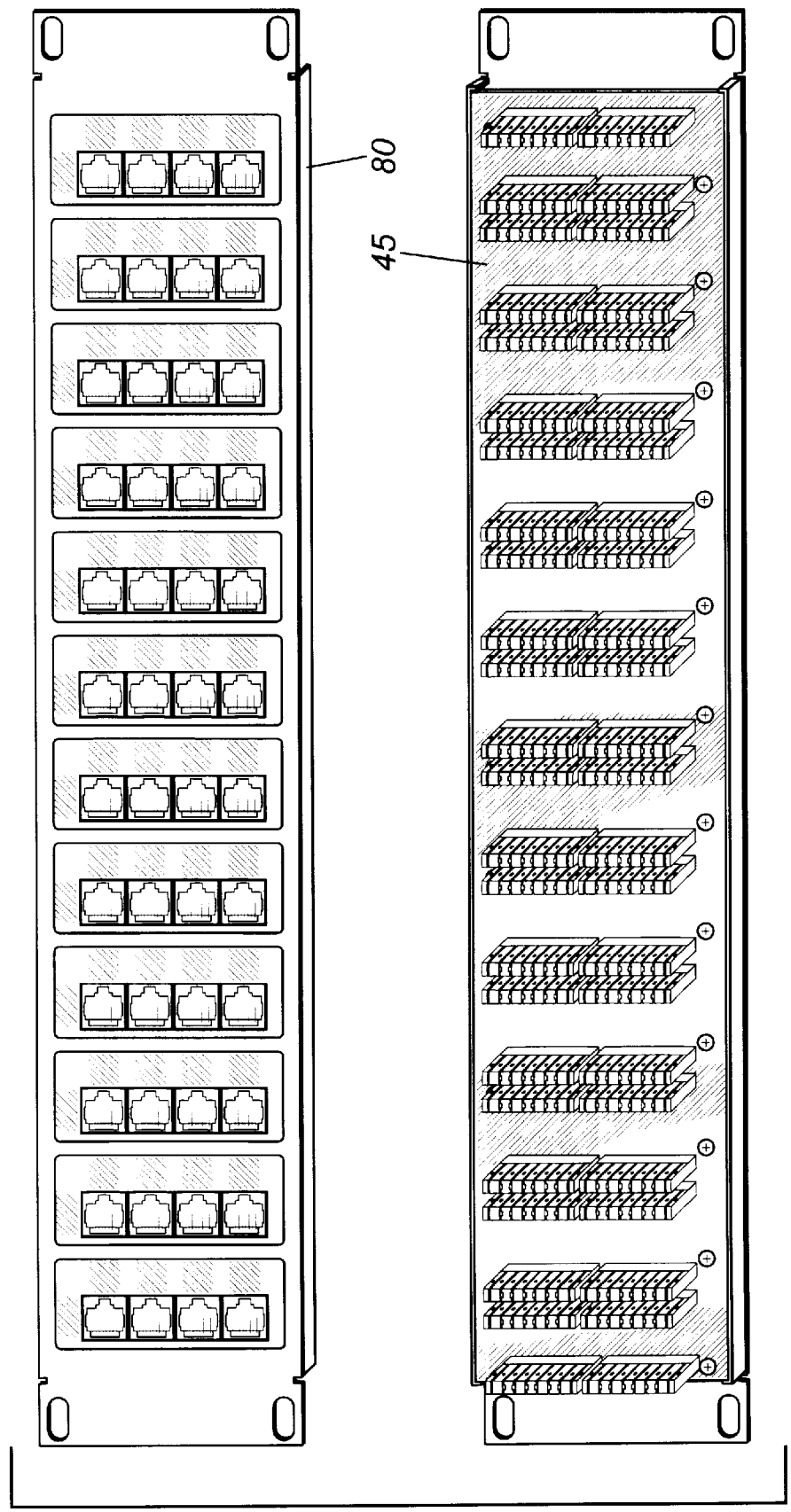
FIG. 5A provides a front view and a rear view of a 48 port patch panel of a preferred embodiment of the present invention.
Figure 5B:
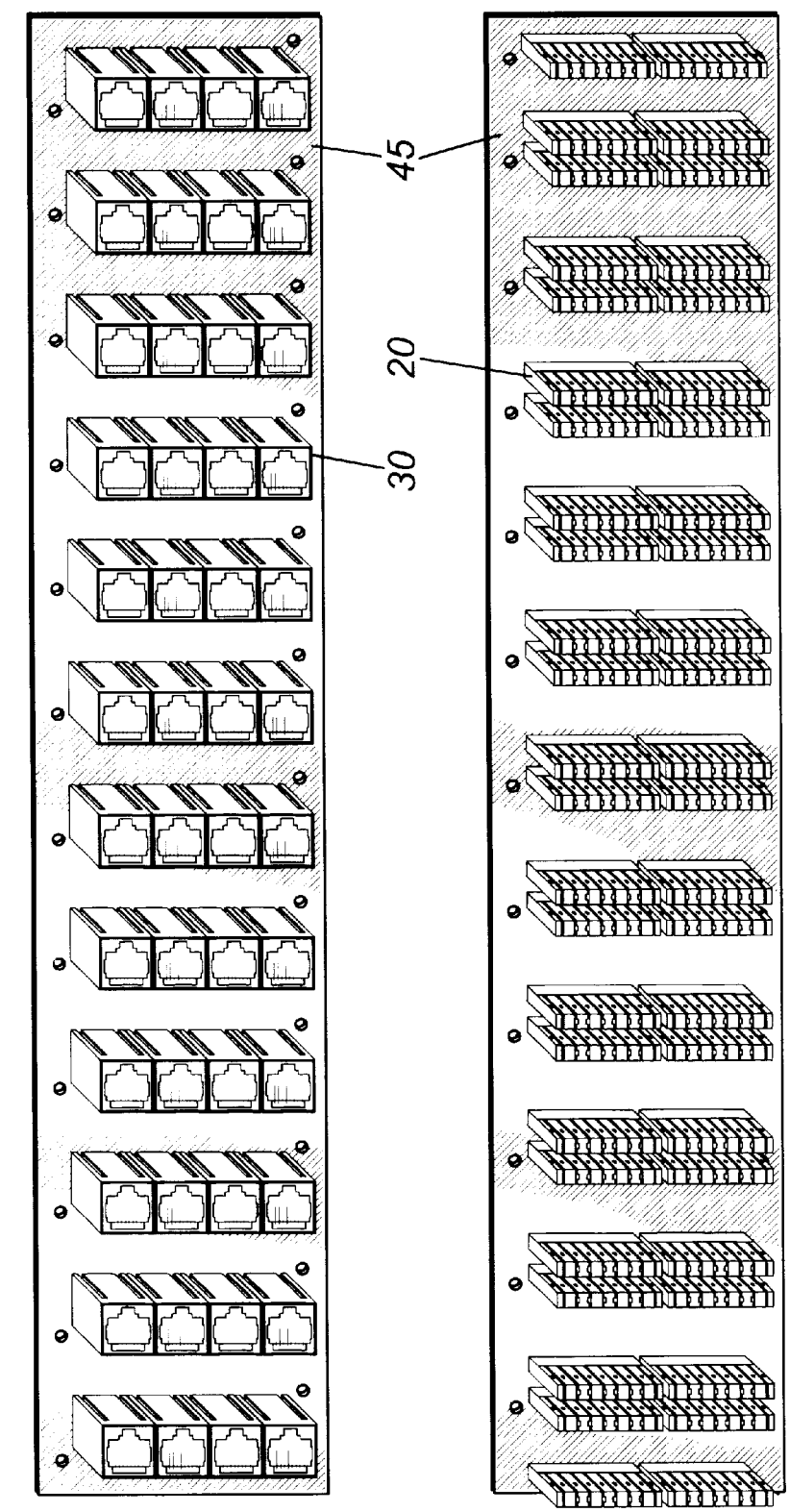
FIG. 5B provides a front perspective view and a rear perspective view of a 48 port populated PCB of a preferred embodiment of the present invention.
Figure 6A:
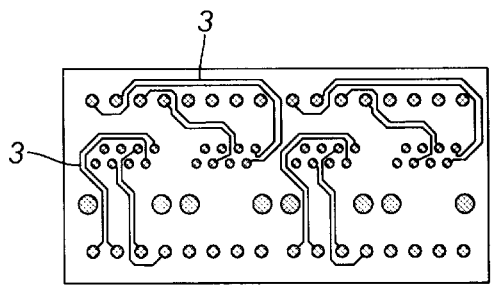
FIG. 6 shows views of the four layers of a preferred embodiment of the printed circuit boards of the present invention.
Figure 6C:
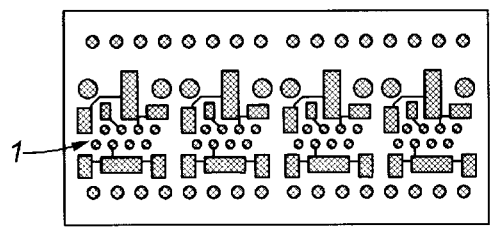
Figure 6B:
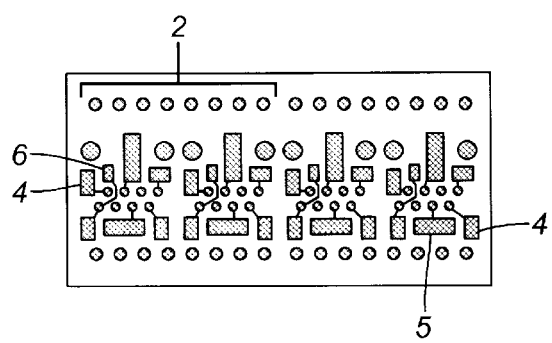
Figure 6D:
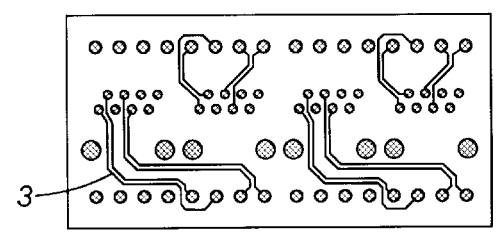

3) The Information Outlet or wall units of the present invention utilizes a printed circuit board assembly, indicated as 90 in FIG. 2A and 100 in FIG. 3A, with the jacks 30 and 110 blocks 20 already assembled and attached to the PCB, indicated as 15 in FIG. 2B and 25 in FIG. 3B, as shown in FIGS. 2A, 2B, 3A, and 3B. The modular jack/insulation displacement/printed circuit board assembly used in the information outlet is an exact replication of any of the vertical jack groupings as found on the patch panel assembly. This allows installers to work with components that are common to both the wall outlet and the patch panel, which will improve installer efficiencies and diminish installation times.

4) The physical arrangement and size of the wall outlet subassembly provides the installer with hardware that it is safer to use (in the case of the wall plate assembly) because it is larger and is less subject to slipping or moving while the wires are being punched down and terminated. It also will result in less damage to the walls and floors as a result of miscues during installation. With fewer piece parts involved (2 vs 5) there are fewer parts to handle and less clean up after installation.

The printed circuit board for the patch panels, and information outlets, has been designed such that the RJ45 jacks and 110 blocks are mounted in vertical rows of 2 for the 24 port and vertical rows of 4 for the 48 port. The circuit layout of the PCB has been designed specifically to accommodate this layout.

The RJ45 blocks are placed in the appropriate locations and wave-soldered in place. The 110 blocks are then inserted in their respective locations and press fitted to the PCB.

The PCB, populated with the jacks and 110 blocks is then tested for specification compliance and attached to the front panel with ⅜" 4–40 self-tapping phillips head screws. There are 16 screws for the 24 port and 24 for the 48 port front panel.

The front panel is made from aluminum or cold rolled steel. The edges are formed in a "U" shape to provide maximum rigidity. The back side of the "U" is drilled with a hole patten that is compatible with the mounting holes in the PCB. The sides contain the mounting holes for installation on the rack. The panel is either painted with a high quality powder paint (or an equivalent) or is black anodized.

Wall Plate Units

Each wall plate assembly contains two basic elements: the PCB 15 in FIG. 2B, 25 in FIG. 3B with the RJ45 jacks 30 and the 110 blocks 20 attached and a molded wall plate, indicated as 50 in FIG. 2A and 60 in FIG. 3A. The PCB assembly is attached to the premise wiring coming from the wall and then snapped into the wall plate, which in turn is screwed into the wall.

The assembly is then tested to certify Cat5 compliance and the front of the wall plate is labeled to reflect its location and purpose: data, Fax, printer, voice etc.

The Information Outlets or wall units of the present invention offer the following features that are not offered by current market offerings.

1) It contains the same circuit as the patch panel. This guarantees consistent electrical performance.

2) It can be labeled to correspond to a specific bank of 4 jacks on the patch panel. This simplifies moves, adds and changes, because a patch panel can be organized to reflect the physical layout of the wall outlets.

3) The PCB subassembly can be installed and tested prior to being snapped into the wall plate and attached to the wall. The completed subassembly can then be stuffed into the wall cavity and attached to the wall plate at a later date. This gives the installer more flexibility in scheduling a job, since the PCB assembly can be punched down and tested independent of priorities associated with other building trades.

4) Current market offerings do not offer a wall plate PCB assembly that is the same physical layout as the patch panel (or vice-versa). Since the information outlet PCB layout of the present invention is basically one 4 port array of patch panel, installers are working with the same physical layout at all times. This will provide for continuity and increased efficiency during installation.

The 110 blocks are field replaceable in both the patch panel as well as the information outlet. The design of the present invention utilizes a 110 block that is attached to the PCB via insulation displacement technology. If a 110 block is broken or damaged while punching-down the wire, it can be replaced in the field. The installer can extract the block from the board and reinsert a new one without having to undo the panel from the rack or the PCB subassembly from the information outlet.

PC Board Design

Well balanced signals can be sent down a properly constructed cable composed of multiple unshielded twisted pairs with minimal cross talk between pairs, provided that the twisted pairs do not have a simple harmonic relationship in their twists. However, when such a signal enters a connector, the relationship between the contacts can well determine the system level of cross talk (which is defined as an unwanted signal transferred from one pair to the next). For more than 15 years a modular telephone connector (called RJ45 by much of the trade) has been in widespread use as the connector of choice for data communications over unshielded twisted pair (UTP) wiring.

As the frequency of local area networks (LAN) has increased, the RJ45 connector (involving both the jack receptacle and the cord plug) became a serious limiting factor in successful transmission. The source of the problem was the way the pairs traversed within the connectors. For historical reasons having to do with symmetry in pair reversals within telephone wiring, instead of pairs always using adjacent pins, one pair straddled another. Not only did this straddling seriously degrade signal integrity of the straddled pairs (by increasing cross talk), but also removing the return path adjacency in the straddling pair, causes increased cross talk between the closest wire of the straddling pair and the outer pairs. This is because two pairs, side by side, with appropriate spacing between wires of one pair, will not have as much cross talk as when one of the pairs has separated wires.

This connection scheme, along with the basic design of the connector, creates unacceptable levels of cross talk at the upper frequencies specified by the industry standard. However, because the connectors are still electrically small with respect to the upper frequency involved (100 MHZ), the imbalance and cross talk noise introduced at the connector can be compensated for by the appropriate addition of lumped elements inductors and capacitors. These lumped elements should be symmetrically applied to the two wires comprising each pair.

The Telecommunications Industry Association (TIA), part of the Electronics Industry Association, evolved a series of specifications, now embedded in their document 568A, that, if met, would allow the transmission of data up to a 100 MHZ rate within buildings. This document included a specification for frequency dependent cross talk that could not be met by current industry standard connector without some form of compensation.

In addition to the modular connector, there is a need for connecting the permanent premise wiring to a patch system. The usual industry way is to use insulation displacement methodology. A popular insulation displacement connector ("IDC") is the 110 block (originally introduced by ATT, but now almost universally used). Thus the modular patch system used for building wiring interconnection also has this IDC as part of its construction.

It has been shown that capacitance compensation alone is sufficient to reasonably meet or exceed the requirements of EIA/TIA 568. This technique has produced results that are as much as 6 db above the requirements of 40 db min. at 100 MHZ. In order not to add discrete capacitors, a multiple layered printed circuit board (PCB), which is already necessary to consistently and repeatedly connect the two connectors (modular jack and IDC receptacle), can be used to achieve the necessary capacitance.

There are a variety of methods that have been devised to improve cross talk. The Denkmann patent (U.S. Pat. No. 5,185,547) issued Feb. 16, 1993 showed how rearranging the wires between the modular portion and the 110 style terminations would induce canceling cross talk to improve performance. Later the Brownell patent (U.S. Pat. No. 5,299,956) issued Apr. 5, 1994 would apply the same idea, but on a PCB. These methods use trace proximity with both capacitive and inductive effects to perform the compensation.

Another method is to add purely capacitive compensation. While one or more units on the market use discrete capacitors (surface mounted on a PCB that connects the RJ45 to the 110 block), most designs build the small (1–2 pf) capacitors constructed as an integral part of the PCB by means of conductive pads separated by the insulating materials from which the PCB is constructed. This can be easily accomplished by specifying large areas between the two surfaces or by creating buried layers, thereby reducing the distance between the plates. The buried layer approach necessitates a more expensive PCB, but reduces the necessary areas to a manageable size for the PCB layouts. An approach to eliminate the need for a buried layer by creating a matrix of conductive through holes has been patented by Siemon U.S. Pat. No. 5295869 issued Mar. 22, 1994.

The RJ45 has 8 contact pins. The pair designation is:

Pair 1—pins 4 and 5
Pair 2—pins 3 and 6
Pair 3—pins 1 and 2
Pair 4—pins 7 and 8

This designation is called the T568A configuration by the referenced TIA document. There is another configuration called T568B that was designated as an alternative. This discourse will refer to the T568A version. It should be noted that the principles apply to the T568B version as well and that both configurations are to be covered by this filing.

It has been demonstrated that compensation sufficient to correct the RJ45 deficiencies only needs to be between pins 3&5 and 4&6 for the straddled pairs 1&2 and pins 1&3 and 6&8 for the outlying pairs. Such a compensation sequence is not necessarily optimal from a balance standpoint, but the EIA standard is currently silent on the issue of pair balance. The design of the present invention uses the balanced compensation method.

A subject of this invention is a correction to the problem created by the above compensation. Note that if there is compensation between pins 1&3 and also 3&5, then there is effectively compensation between pins 1&5 only provided pin 3 is not restricted in some way. Since the test protocol recommended by the EIA uses short test leads (about 2") and leaves unused test pairs floating (e.g., pair 2 or pins 3&6, when testing between pairs 1 and 3) without a lot of loading to ground, pin 3 is floating.

Simple theory teaches that this compensation between pins 3 & 5 will be about half of the capacitances when they are of similar size (actually the harmonic mean for capacitances in series), a not insignificant effect. By exactly the same reasoning, there is a capacitance between pins 4&8. To compensate for both of these parasitic capacitances, small capacitances between pins 1&4 and 5&8 may need to be added.

In the preferred design, all the capacitances are constructed as close to the RJ45 as is reasonably possible. The capacitance layers are placed on the copper clad inner core with the connecting traces placed on the top and bottom layers. Four layered PCB's are normally constructed from a copper clad core that is further built up with layers of uncured board material with a final layer of copper foil added to create the specified board thickness.

A further refinement is to note that the 110 block can introduce some unwanted coupling between pairs and then modifying the total capacitance correspondingly.

Further note that the preferred placement for these compensating capacitors is as close to the 110 blocks as is reasonably possible. Ideally, any compensation should be as close to the need as possible to minimize phase shifting of the compensating signal with respect to the need. Simple capacitive compensation relies on the minimal phase differences between the degrading element and its compensation at 100 MHZ for the millimeter distances involved.

Printed Circuit Board Issues

If a pad is placed on both sides of a two layer PCB, the capacitance between the pads will depend on the dielectric constant as well as the area of and the distance between the pads. With standard 63 mil (0.063) boards, the required area is so large that dense layouts required to make compact PCB's is impractical. However, a multi layer board incorporating a buried layer can shrink the required pad sizes.

There are several methods used to create buried layers. A problem with these buried layers is that the technology of multi-layer boards was developed for digital circuit boards where the physical stability of the spacing is not an issue. Thus, the method of creating the multiple layer "sandwich" with uncured epoxy filled glass fiber mats (prepregs) is not stable enough, both dimensionally and dielectrically, for the needed precision. Note that the Siemon patent referenced earlier eliminated the problem by using an interleaved matrix of drilled through holes instead of unstable prepreg to achieve the required stability.

Figure 7:
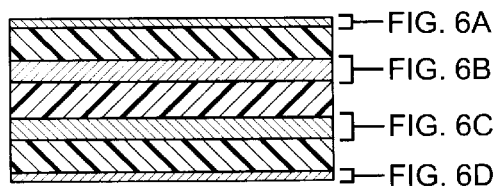
FIG. 7 shows a view of the printed circuit board layer sequence.

The inventor's solution to this problem was to create the necessary capacitance on the sides of the core of the PCB. See FIG. 7. The core is a pre-manufactured board of much less thickness (typically 22 to 28 mils thick) than the final board. The capacitors are etched in the copper clad core before adding the prepregs. Because the core is pre-manufactured by a continuous process, its dimensional and dielectric stability is naturally greater and if necessary can be screened by incoming inspection before further operations. The final board is built of prepregs on both sides of the core and then finished with copper foil that is etched to the required interconnecting pattern.

For the interconnections to the PCBs, it is important that the wires behave as transmission lines minimizing signal degradation due to frequency dependent phase and gain losses. At the frequencies in question (100 MHZ), an isolated, several inch long wire can exhibit a significant amount of inductance, affecting transmission performance. Pairing the wire with another wire appropriately spaced, taking into account the wire size and the dielectric involved, will effectively compensate for the effects of the inductance by turning the wires into a somewhat frequency independent transmission line (only provided the signal is reasonably balanced, a necessary requirement for sending signals over unshielded twisted pair wiring).

This becomes particularly important when attempting a single compensation for the two induced sources of cross talk. Specifically, both the modular jack and the IDC receptacle will create capacitance imbalances. Any unpaired wiring that connects these two items and the buried compensating capacitance by introducing a lumped inductance between the two differing lumped capacitances can create a different result in testing according to the direction chosen. A proper pairing will minimize this problem.

FIG. 6 illustrates and embodies the concepts discussed above. The connections between the RJ45 (the eight small holes grouped in two offset rows ) 1 and the 110 block (eight larger in-line holes) 2 have been paired, creating transmission lines 3. The core pads 4 are sufficiently close 5 to the RJ45 to minimize problems of inadequate cancellation due to phase differences of the plug/jack induced cross talk and the capacitive compensation. Finally, a smallest pad 6 adjusts for the pass through effects of the series compensating capacitors when the straddled pair circuit is floating. Note that only one small pad is added because it was determined, in practice, that the actual margins were adequate without the second one.

Because many varying and difference embodiments may be made within the scope of the invention concept taught herein which may involve many modifications in the embodiments herein detailed in accordance with the descriptive requirements of the law, it is to be understood that the details herein are to be interpreted as illustrative and not in a limiting sense.

What is claimed as invention is:

1. A compact assembly for use with wiring node interconnection in a data network, using high performance data cable, comprising:

a patch panel having at least one pair of 110 blocks;

modular jacks, said modular jacks arrayed in pairs between said pair of 110 blocks and arranged in vertical rows;

said 110 blocks arranged in pairs in vertical rows, each pair comprising one rack unit;

a first multilayer printed circuit board electrically connected to said modular jacks and said 110 blocks, an information outlet having a multiplicity of pairs of modular jacks;

a multiplicity of pairs of 110 blocks;

a second printed circuit board electrically identical to said first board and electrically connected to said jacks and said blocks.

2. The assembly of claim 1, wherein said information outlet includes a snap fitted molded wall plate covering said second printed circuit board.

3. The assembly of claim 1, wherein said information outlet jacks are arranged vertically corresponding to two of said vertical mounted modular jacks of said patch panel.

4. An assembly for use with wiring node interconnections in a local area network using unshielded, twisted pair telephone wire, comprising:

a patch panel having modular jacks, said modular jacks arranged in short vertical rows extending the width of said panel;

110 blocks;

a first printed circuit board electrically connected to said modular jacks and said 110 blocks;

an information outlet having a jack having means to attach to the wire;

a 110 block;

a second printed circuit board electrically connected to said jack and said block;

said jack having means for being electrically connected to one of said modular jacks;

said information outlet includes a second jack, said jacks being arranged vertically corresponding to two of said vertical mounted modular jacks of said patch panel; and wherein said second printed circuit board includes a second printed circuit, and said first printed circuit board includes a first printed circuit for each two of said modular jacks;

said first printed circuit and said second printed circuit being substantially identical.

5. The assembly of claim 3, wherein said patch panel has a first set of labels and said information outlet has a second label, said second label corresponding to one of said first set of labels.

6. The assembly of claim 1, wherein said information outlet is preassembled.

7. The assembly of claim 1, wherein said first printed circuit board and said second printed circuit board includes lumped capacitive elements symmetrically applied to two of the wires which are the twisted pair, said capacitance being close to said modular jacks of said patch panel and said modular jacks of said information outlet.

8. The assembly of claim 7, wherein said capacitance is close to said 110 blocks.

9. The assembly of claim 7, wherein there is further included small capacitance between pins 1 and 4 of said modular jacks of said patch panel and said modular jacks of said information outlet.

10. The assembly of claim 7, wherein there is further included small capacitance between pins 5 and 8 of said modular jacks of said patch panel and said modular jacks of said information outlet.

11. An assembly for use with wiring node interconnections in a local area network using unshielded, twisted pair telephone wire, comprising:

a patch panel having modular jacks, said modular jacks arranged in short vertical rows extending the width of said panel;

110 blocks;

a first printed circuit board electrically connected to said modular jacks and said 110 blocks;

an information outlet having a jack having means to attach to the wire;

a 110 block;

a second printed circuit board electrically connected to said jack and said block;

said jack having means for being electrically connected to one of said modular jacks;

said first printed circuit board and said second printed circuit board includes lumped capacitive elements symmetrically applied to two of the wires which are the twisted pair, said capacitance being close to said modular jacks and said jack; and wherein said first and second printed circuit boards have a copper clad inner core, and a top and bottom layer said capacitance layers being placed on said copper clad inner core and having connecting traces on said top and bottom layer.

12. The assembly of claim 11, wherein said capacitance is located on the sides of said copper core inner core.

13. The assembly of claim 1, wherein said 110 blocks are presfitted onto said second printed circuit board.

14. The assembly of claim 13, wherein said 110 blocks are presfitted onto said first printed circuit board.

15. The assembly of claim 14, wherein said modular jacks of said information outlet are wave soldered onto said second printed circuit board.

16. The assembly of claim 15, wherein said modular jacks of said patch panel are wave soldered onto said first printed circuit board.

17. An assembly for use with wiring node interconnections in a local area network using unshielded, twisted pair telephone wire, comprising:

a patch panel having modular jacks;

110 blocks;

a first printed circuit board electrically connected to said modular jacks and said 110 blocks;

an information outlet having a jack having means to attach to the wire;

a 110 block;

a second printed circuit board electrically connected to said jack and said block;

said jack having means for being electrically connected to one of said modular jacks;

said first printed circuit board and said second printed circuit board include lumped capacitive elements symmetrically applied to two of the wires which are the twisted pair, said capacitance being close to said modular jacks and said jack;

said first and second printed circuit boards have a copper clad inner core, and a top and bottom layer, said capacitance being placed on said copper clad inner core and having connecting traces on said top and bottom layers; and said capacitance is located on the sides of said copper clad inner core.

18. The assembly of claim 17, wherein said capacitance is close to said 110 blocks.

19. The assembly of claim 17, wherein there is further included small capacitance between pins 1 and 4 of said modular jacks and said jack.

20. The assembly of claim 17, wherein there is further included small capacitance between pins 5 and 8 of said modular jacks and said jack.

21. The assembly of claim 17, wherein said information outlet includes a snapfitted molded wall plate covering said fitted molded wall plate covering said second printed circuit board.

22. The assembly of claim 17, wherein said information outlet includes a second jack;

said modular jacks being arranged in short vertical rows extending the width of said panel; and said jacks being arranged vertically corresponding to two of said vertical mounted modular jacks, of said patch panel.

23. The assembly of claim 22 wherein said second printed circuit board includes a second printed circuit, and said first printed circuit board includes a first printed circuit for each two of said modular jacks;

said first printed circuit and said second printed circuit being substantially identical.

24. The assembly of claim 22, wherein said patch panel has a first set of labels and said information outlet has a second label, said second label corresponding to one of said first set of labels.

25. The assembly of claim 17, wherein said information outlet is preassembled.

26. The assembly of claim 17, wherein said first printed circuit board and said second printed circuit include means for suppressing crosstalk.

27. The assembly of claim 17, wherein said 110 block is presfitted onto said second printed circuit board.

28. The assembly of claim 27, wherein said 110 blocks are presfitted onto said first printed circuit board.

29. The assembly of claim 28, wherein said jack is wave soldered onto said second printed circuit board.

30. The assembly of claim 29, wherein said modular jacks are wave soldered onto said first printed circuit board.

31. The assembly of claim 1, wherein said first multilayer printed circuit board includes crosstalk cancellation means for cancelling crosstalk, said first multilayer printed circuit board being electrically connected with said crosstalk cancellation means to said modular jacks and said 110 blocks.

* * * * *